United States Patent [19]

Brown et al.

[11] Patent Number: 4,914,741
[45] Date of Patent: Apr. 3, 1990

[54] TAPE AUTOMATED BONDING SEMICONDUCTOR PACKAGE

[75] Inventors: Kenneth M. Brown, North Andover; Robert J. Hannemann, Wellesley, both of Mass.; Stephen P. Hansen, Amherst, N.H.

[73] Assignee: Digital Equipment Corporation, Maynard, Mass.

[21] Appl. No.: 59,051

[22] Filed: Jun. 8, 1987

[51] Int. Cl.$^4$ .................. H01L 23/54; H01L 23/48
[52] U.S. Cl. .............................. 357/74; 357/68
[58] Field of Search ................ 357/70, 74, 68, 71

[56] References Cited

U.S. PATENT DOCUMENTS

| | | | |
|---|---|---|---|
| 3,657,805 | 4/1972 | Johnson | 357/74 |
| 4,064,552 | 12/1977 | Angelucci et al. | 361/414 |
| 4,218,701 | 8/1980 | Shirasaki | 357/74 |
| 4,330,790 | 5/1982 | Burns | 357/70 |
| 4,355,463 | 10/1982 | Burns | 357/70 |
| 4,466,183 | 8/1984 | Burns | 29/827 |
| 4,472,876 | 9/1984 | Nelson | 29/840 |
| 4,510,017 | 4/1985 | Barber | 357/70 |
| 4,530,002 | 7/1985 | Kanai | 357/70 |
| 4,551,746 | 11/1985 | Gilbert et al. | 357/74 |
| 4,577,214 | 3/1986 | Schaper | 357/70 |
| 4,621,278 | 11/1986 | Miura | 357/70 |
| 4,672,418 | 6/1987 | Moran et al. | 357/74 |

Primary Examiner—Rolf Hille
Assistant Examiner—S. V. Clark
Attorney, Agent, or Firm—Nutter, McClennen & Fish

[57] ABSTRACT

A semiconductor package for protecting a semiconductor chip such as a Very Large Scale Integration chip and connecting it to an electrical circuit is disclosed. The chip is bonded to a section of Tape Automated Bonding, (TAB), tape which contains a number of leads thereon, each lead has an inner lead section bonded to the chip and an outer lead section that extends beyond the outer perimeter of the tape, for connecting to the circuit. The chip is enclosed in a housing which subtends an area slightly larger than the chip itself. The inner lead sections project from the TAB tape into the housing and are bonded to the chip. A metal layer under the TAB tape is connected to a number of the leads. After the semiconductor package of this invention is assembled, the outer leads are attached to the associated circuit so as to connect the chip to the circuit. The metal layer serves as a reference plane so the leads connected thereto supply a voltage that does not very to sub-circuits on the chip.

17 Claims, 5 Drawing Sheets

TAPE AUTOMATED BONDING SEMICONDUCTOR PACKAGE

FIELD OF THE INVENTION

This invention relates generally to the field of packaging for integrated circuit chips, and more particularlly to tape automated bonding packaging.

BACKGROUND OF THE INVENTION

Packaging is one of the final steps in the process of manufacturing integrated semiconductor circuit components or chips. In packaging, a fabricated semiconductor chip is mounted in a protective housing. After packaging, the assembled component is subjected to final testing and then connected to an electronic circuit.

Currently, many semiconductor chips are contained in plastic packages. These packages are provided with reinforced metal leads for electrically connecting the chip to the printed circuit board which contains the circuit in which the chip is to be included. Within the package, one end of each lead is connected to a specific bonding point on the chip, usually by an intermediate lead; the other end of the lead, which extends outside of the package, is attached to a connection on the printing circuit board.

Recently, advances in semiconductor manufacturing technology have made the fabrication of Very Large Scale Integration (VLSI) chips possible. VLSI chips comprise a large number of individual circuit components that are fabricated together on a single, very small chip. VLSI chips are able to perform a large number of electrical functions, and perform them more rapidly, than was previously possible.

To date, it has been difficult to provide suitable packaging for VLSI chips. In part, this is because each chip requires a large number of connections to external circuit elements. Many VLSI chips have 100 to over 300 bonding points each of which must be connected to a lead for connection to external circuit elements.

Another consideration in the use of a VLSI chip is the need to provide common voltages to a number of different locations on the chip. For instance, a chip that comprises a number of individual transistors, such as C-MOS type transistors, may require a common drain voltage supplied by an external power supply that is applied to the drain terminals of all the transistors, and a common source voltage also provided by an external power supply applied to the source terminals of all the transistors. Typically the drain voltage is positive with respect to a common reference or ground voltage, and the source voltage is typically at the same level as the ground voltage. The common voltages need to be supplied to the chip so the individual components all operate with respect to a common power level. Normally, common voltages are supplied to the components on the chip by providing sets of leads, each set designed to carry the same voltage, to different bond points on the chip.

Providing a VLSI chip with a common voltage at a number of locations has, to date, been a difficult task. In a VLSI package, the leads which are connected to the chip are spaced closely together. Moreover, some of the leads supply voltages such as signal voltages that fluctuate rapidly as electronic functions are performed on them by the chip and the other circuit components. This causes the magnetic field normally developed around these leads to vary, which in turn, causes an inductive current to flow in adjacent leads. Whenever a sufficiently large inductive current is developed in a common voltage lead, the voltage it is carrying changes. This problem may be intensified because in a VLSI chip such as a digital logic chip, voltages may fluctuate rapidly, this rapid change intensifies the development of a magnetic field and the associated inductive current flow. As a result, the voltage supplied to one or more components on the VLSI chip may vary so greatly as to cause the chip to malfunction.

There have been some attempts at providing packages for VLSI chips that are designed to minimize the problems associated with the development of inductive current flow. One such package is a multi-layered ceramic package. This package includes layers of conductors separated by layers of dielectric ceramic that are pressed together. A cavity is formed in the layers, and the chip is mounted in the cavity. Wire bonds are used to connect the bond points on the chip to the individual conductors on the top layer of conductors. Individual wire bonds or reinforced metal leads are used to provide an electrical connection to the printed circuit board the chip is attached to. Selected top-layer conductors, which carry common voltages, are connected to common intermediate-layer conductors. The intermediate-layer conductors function as reference voltage planes which insure the common voltages supplied through the top-layer conductors attached thereto does not appreciably vary.

However, there are a number of limitations associated with multi-layer ceramic packages. The size of these packages tends to be extremely large in order to accommodate the interconnections needed between the conductor layers. Moreover, a multi-layered ceramic package designed to contain a VLSI chip is expensive to manufacture. In some instances, the cost of the multi-layered ceramic package may significantly exceed the cost of fabricating the chip.

SUMMARY OF THE INVENTION

The invention provides a new and improved semiconductor chip package that occupies a minimal amount of space, is easy to assemble, and economic to manufacture, and which minimizes inductive voltages that can disrupt the voltage over the common power supply leads in the semiconductor chip assembly.

In brief summary, the new package includes a housing for a chip bonded to a frame of TAB (Tape Automated Bonding) tape. The TAB tape comprises an insulating film which supports a number of conductive leads formed on it. The TAB tape includes a center opening where the chip is to be located. Each conductive lead has an inner portion which projects into the center opening and is attached to a bond point on the chip; and an outer portion which projects beyond the outer perimeter of the film and is attached to a contact on the printed circuit board. The housing covers the chip and a small portion of the TAB tape inner lead portions.

A layer of conductive film is attached to the surface of the TAB tape opposite the leads. The conductive film subtends an area around the TAB tape. Vias electrically connect the leads on the TAB tape that provide a common voltage to the components on the chip.

An advantage of this semiconductor package is that it connects directly to the external circuitry without the use of an additional level of reinforced leads between the chip and the external circuitry. This eliminates the need to provide a large package for the chip that would obviate the advantage gained by miniaturization. Moreover, this significantly reduces the complexity of providing the chip package, and substantially reduces the cost of its manufacture.

The conductive film serves as a reference plane for the common voltage such as a ground voltage. Since the common voltage leads each are connected to the conductive layer, the voltage across each lead to their respective bond points on the chip are identical. In other words, the conductive film minimizes the affect of inductive voltage flux in the common voltage leads so each such lead provides a constant common voltage to the chip component it is connected to.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIG. 3A is a magnified cross-section view of a portion of the TAB semiconductor package shown in FIG. 3.

DETAILED DESCRIPTION OF AN ILLUSTRATIVE EMBODIMENT

Figure 1:
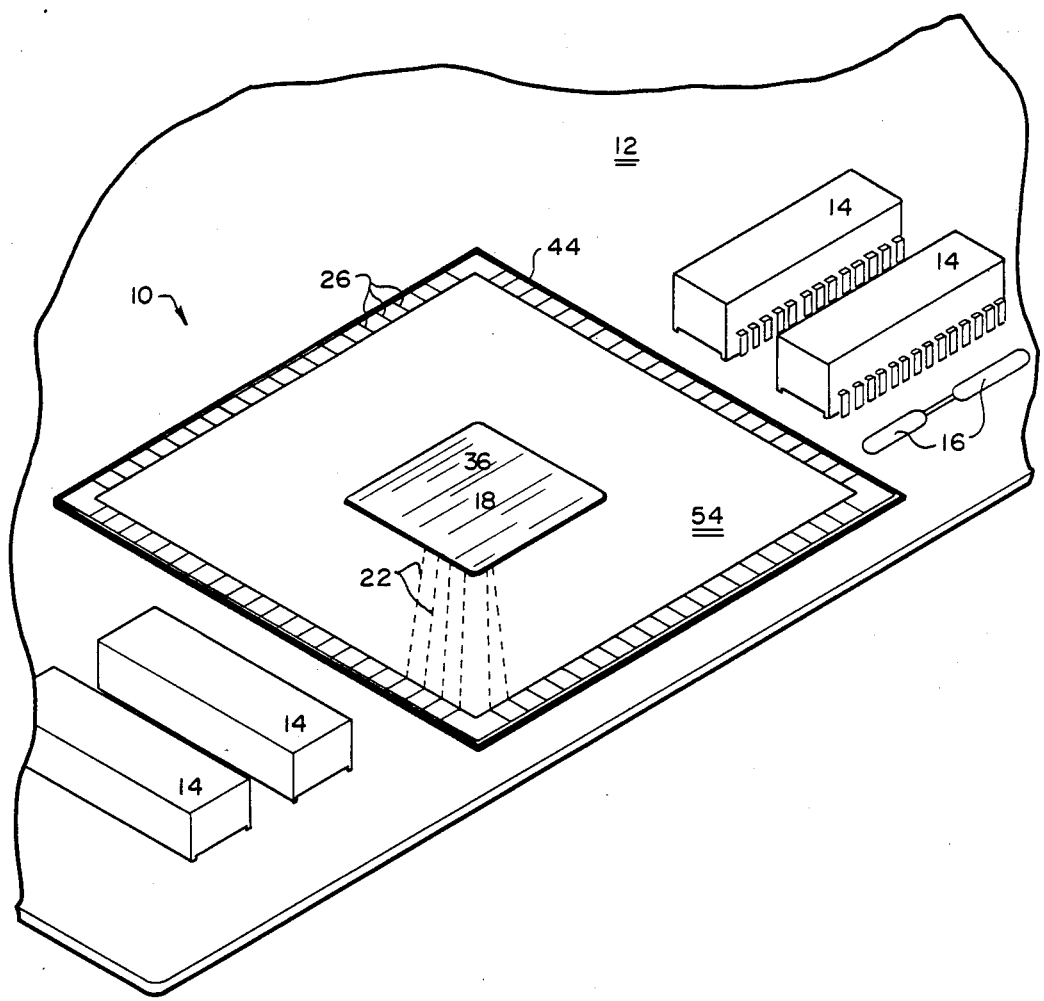
FIG. 1 is a perspective view of a TAB semiconductor package of this invention attached to a printed circuit board containing an electronic circuit.

FIG. 1 illustrates a Tape Automated Bonding (TAB) semiconductor package 10, constructed in accordance with this invention, attached to a printed circuit board 12. Adjacent the TAB semiconductor package 10 are conventional plastic semiconductor packages 14 and other components 16 that are part of the electronic circuit assembled on the printed circuit board 12.

Figure 2:
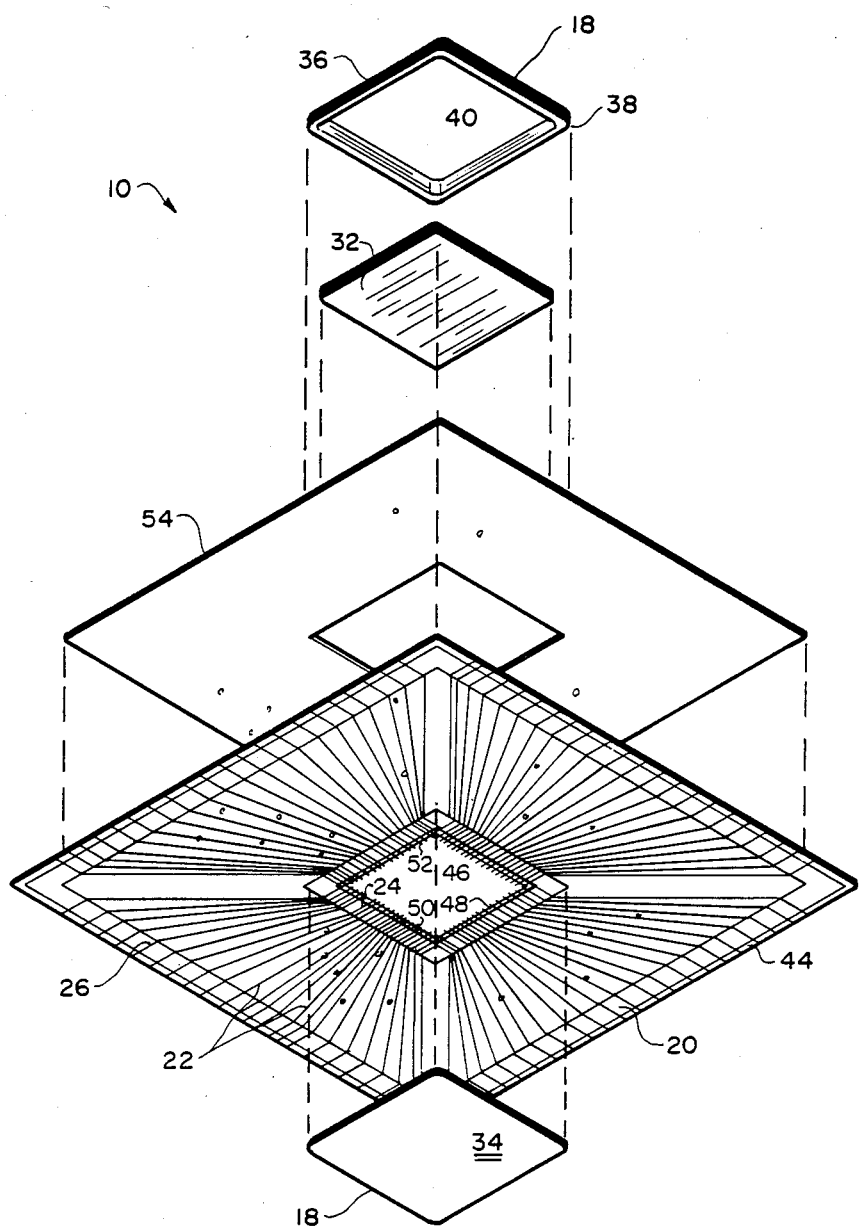
FIG. 2 is an exploded view, from the base of the housing, showing the disassembled TAB semiconductor components of this invention.
Figure 3:
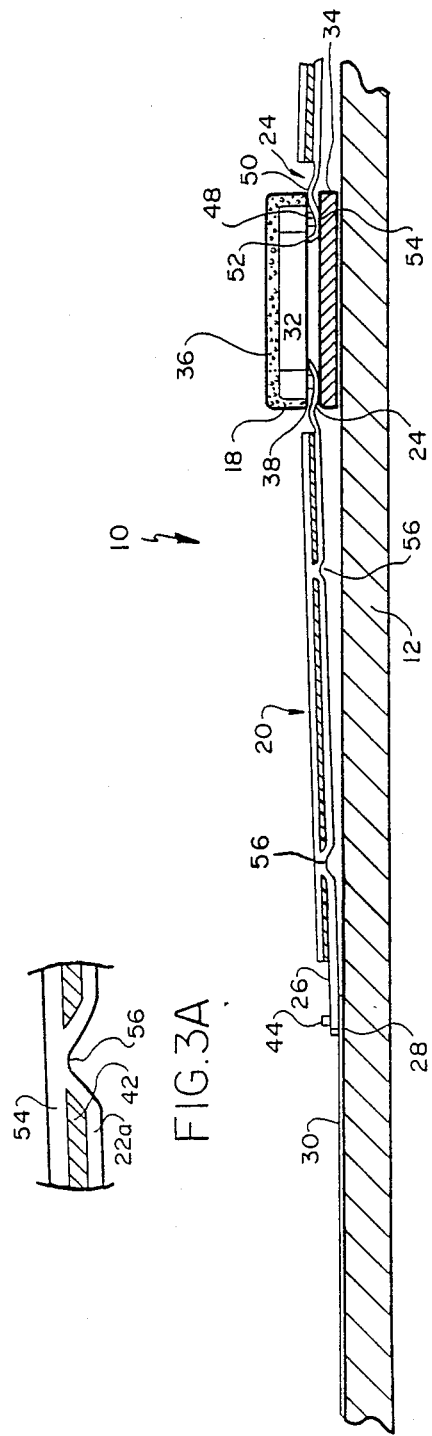
FIG. 3 is a cross-section view of the TAB semiconductor package of this invention.

Referring to FIGS. 2, 3, and 3A, the TAB semiconductor package 10 of this invention is shown in greater detail. The TAB semiconductor package 10 includes a housing 18, containing a semiconductor chip 32, which is attached to a section of TAB tape 20 that surrounds the housing. The chip 32 and housing 18 subassembly is housed in a center opening 46 formed in the TAB tape 20. A number of conductive leads 22 are plated on the surface of the TAB tape 20. Each lead 22 has an inner lead portion 24 that extends into the center opening 46 and is attached to a bond point on the chip 32 within the housing 18, and an outer lead portion 26 attached to a contact pad 28 on the printed circuit board. The contact pads 28 are connected to conductors 30 on the printed circuit board 12 to electrically connect the chip to the appropriate external circuit components.

The chip 32 is contained inside the housing 18 formed of plastic or ceramic which comprises a base 34 on which the chip is seated and a cover 36 which extends over the base and defines a space 40 large enough so the chip may be housed therein. The cover 36 includes rim 38 which defines the perimeter of space 40.

The leads 22 are formed on the TAB tape 20 according to standard TAB practice. The TAB tape may be a film 42 of polymide, Kapton, or other suitable insulating dielectric.

The outer leads 26 each extend out from the outer perimeter of the TAB film 42. An outer support ring 44, also formed of polymide, is spaced away from the TAB film 42, and is secured over the ends of the outer lead portions 26. The outer support ring 44 secures the outer lead sections 26 so that they do not curl or cross, or otherwise become out of registration with the contact pads 28 during bonding thereto. A more detailed explanation of the use of the outer support ring 44 to secure the outer lead portions prior to and during bonding to the contact pads is set forth in co-pending U.S. Pat. application No. 900,789, filed Aug. 27, 1986, of David Hallowell and John Sofia for an "Outer Lead Tape Automated Bonding System", assigned to the assignee of this invention, and incorporated herein by reference.

The inner lead portions 24 each extend into the center lead opening 46 perpendicularly with respect to the inner perimeter of the TAB film 42. An inner support ring 48 that is spaced interiorly away from the inner perimeter of the TAB film 42 prevents the inner lead portions 24 from curling, crossing or otherwise becoming out of registration. The inner lead portions extend inwardly from the inner support ring 48 to provide end sections 52. The TAB tape 42, inner support ring 48 and inner lead portions 28 are dimensioned to provide film-free sections 50 of the inner lead portions 24 approximately equal to the width of the rim 38 of cover 36. The chip 32, rim 38, space 40, and inner support ring 48 are dimensioned so the chip is centered in the space and there is sufficient area between the chip and so that the rim to accomodate the inner support ring.

A layer 54 of conductive metal film is bonded to the underside of the TAB film 42. The metal film layer 54 extends completely underneath all of the TAB film 42, and may also extend under the outer support ring 44 and the inner support ring 48. Vias 56 extend through the TAB film 42 to electrically connect selected leads 22a to the metal film 54. In one specific embodiment of this invention, the leads 22a that are connected to the metal film 54 are connected by a plurality of vias 56 that are spaced apart from each other.

The TAB semiconductor package 10 of this invention is assembled by first bonding the chip 32 to the TAB tape 20 in accordance with standard tape automated bonding practice. The chip 32 is bonded to the TAB tape 20 inside the center opening 46 and within the area defined by the inner perimeter of the inner support ring 48; the inner lead's end sections 52 are connected to bond points on the chip 32.

After tape bonding, the chip 32 is enclosed within the protective housing 18. The base 34 is placed under the chip 32 and the cover 36 placed over the base. Epoxy, or other suitable adhesive, is used to seal the cover 36 and base together at the top surface of cover rim 38. The tape bonded chip subassembly is positioned so that the TAB film and conductive film-free sections 50 of the inner leads 24 are positioned between the rim 38 and the cover 36 so that the adhesive can be applied between the rim and the cover.

The TAB semiconductor package 10 may be assembled by automated equipment. The TAB tape 20 may be provided with conventional excisable test pads (not illustrated), for testing of the assembled package 10. After assembly and testing, the TAB semiconductor package may be installed on the printed circuit board 12. As seen in FIG. 3, the package 10 is mounted on the printed circuit board so the base 34 of the housing 18 and the leads are adjacent the printed circuit board 12, and the cover 36 of the housing and the metal film 54 are exposed. The outer leads 26 may then be attached to the printed circuit board contact pads 28.

The TAB semiconductor package 10 protects the chip 32. Furthermore, the TAB tape 20 of this package 10 can have 400 or more leads 22 etched on it. The package 10 can thus be used to protect and attach a Very Large Scale Integration semiconductor chip directly to a printed circuit board 12.

The package 10 of this invention does not require reinforced metal leads to electrically connect the chip 32 to the circuit board 12 to which it attaches. This eliminates the need to provide lead assemblies, and an associated housing, that encompass a large amount of space. Moreover, since there is no need to provide an intricate lead assembly and an associated housing, this package 10 is very economical to manufacture.

The metal film 54 on the TAB film 42 serves as a reference or ground plane for the leads 22a connected to it by the vias 56. This reduces the magnetic fields that can be developed around the leads 22a by the other leads which carry rapidly changing voltages, such as signal voltages, thereby minimizing the inductive current flow and varying voltages that may develop therein. Thus, the leads 22a can be used to provide an identical supply or reference voltage to the several sub-circuits on the chip 32 that will not too substantially vary between the sub-circuits thereon.

For a C-MOS chip it would thus be desirable to connect leads 22a to the metal film 54 that supplies the reference and source voltages to the components on the chip. The metal film would thus serve as a reference plane for these voltages to minimize their variance. Moreover, the drain voltage tends to vary inversely with any changes in the reference voltage. Magnetic fields produced by changes in the reference and drain voltages would thus be complementary and tend to cancel each other out. The net effect would be to minimize the development of magnetic fields and accompanying voltage variations in the leads carrying voltages both to and from the chip.

Figure 4:
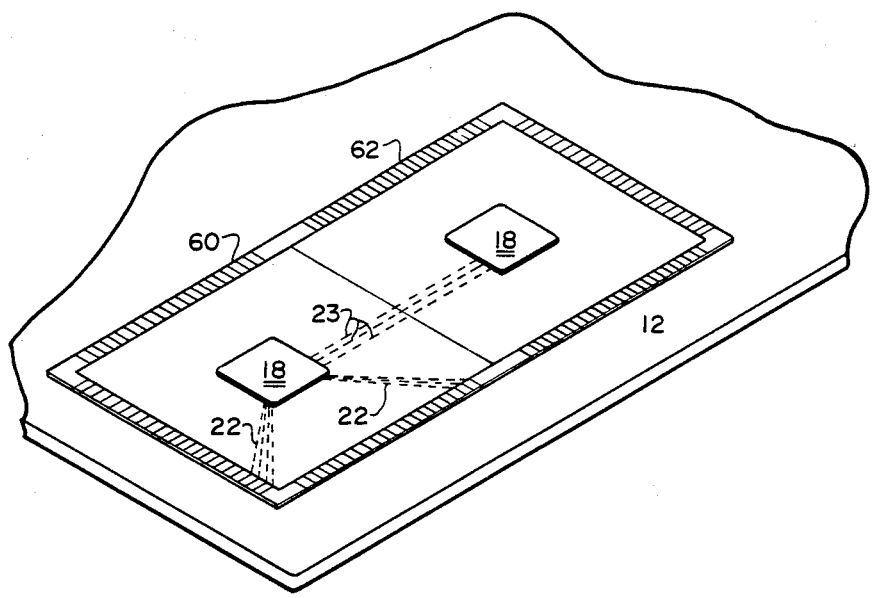
FIG. 4 is a perspective view of an alternative embodiment of the TAB semiconductor package of this invention.

A second embodiment of this invention is depicted in FIG. 4. FIG. 4 illustrates a package assembly 60 according to this invention wherein two chips are enclosed within separate housings 18 attached to a single section of TAB tape 62. Etched on the TAB tape are a number of leads 22 which connect the chips to contact pads 28 on the printed circuit board 12, and a number of other leads 23 extending between the housings 18 to interconnect the chips, shown in phantom. The package assembly 60 may have one section of metal film disposed under the entire TAB tape 62 to provide a reference plane for both chips, or two sections of metal film spaced apart, one adjacent each chip, to provide separate reference planes. Extensions to more than two chips are readily apparent.

Figure 5:
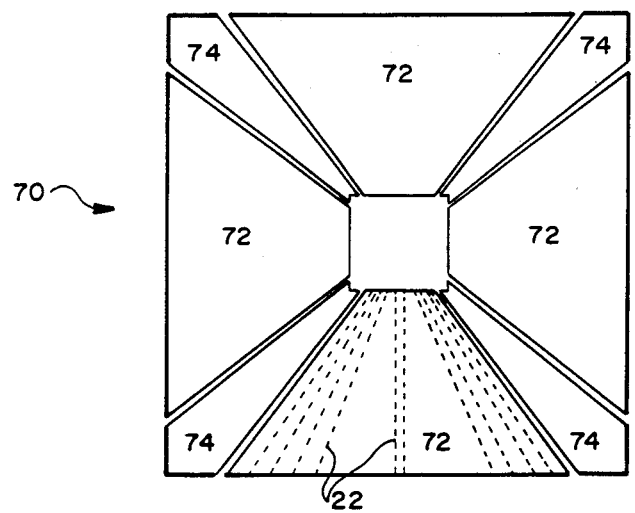
FIG. 5 is a top view of an alternative embodiment of metal film used with the TAB semiconductor package of this invention.

FIG. 5 depicts a layer of metal film 70 that may be used with the TAB tape 20 instead of the single-section layer 54 (FIG. 2). The metal film 70 comprises alternating side portions 72 and corner portions 74 that are separated from each other by approximately 1 to 2 mils. The leads 22, shown in phantom, are arranged so that different sets of leads 22a are electrically connected to an individual side portion 72 or corner portion 74. Thus, the individual side portions 72 and corner portions 74 can function as separate reference planes for different voltages supplied to the chip.

Alternatively, some chips, such as those having emitter-coupled logic, may have another form of reference plane attached to the TAB tape 20 and leads 22.

In the illustrations the chip 32, the inner support ring 48, the TAB film 42, and the outer support ring 44 are shown as having a rectangular profile. This is only one way the elements of the semiconductor package of this invention may be formed. Alternatively, these elements may have other forms, including nonlinear ones.

The foregoing description has been limited to a specific embodiment of this invention. It will be apparent, however, that variations and modifications may be made to the invention, with the attainment of some or all of the advantages of the invention. For example, it may be desirable to attach a heat sink assembly to the top of the cover to provide a means to disipate heat generated by the chip away therefrom. Therefor, it is the object of the appended claims to cover all such variations and modifications as come within the true spirit and scope of the invention.

What is claimed as new and desired to be secured by Letters Patent of the United States is:

1. A semiconductor package for protecting a semiconductor chip, the chip having at least one bond point for electrical connection to an external conductive element, said package comprising:
   (a) a housing enclosing the chip, said housing including an electrically insulating base on which the chip is seated and an electrically insulating cover with a protruding rim defining a space wherein said chip is contained, said base dimensioned to be mated to said rim; and
   (b) section of tape automated bonding tape adjacent said housing, said tape automated bonding tape having a section of electrically insulating tape film adjacent at least a portion of said housing, a plurality of conductive leads on said tape film, each of said conductive leads having an inner lead portion that extends from said tape film into said housing between said housing rim and base and is connected to one of the chip bond points, each of said conductive leads further having an outer lead portion that extends beyond the outer perimeter of said tape film for bonding to an external conductive element, a conductive film opposite the surface of said tape film, and at least two of said conductive leads in electrical connection with said conductive film through said tape film; and
   (c) an adhesive means extending continuously between said housing rim and base and surrounding said conductive lead inner portions that extend therebetween so as to provide a seal between said base and said cover.

2. The semiconductor package of claim 1 further including an inner support ring disposed around said conductive lead inner lead portions, and spaced away from said tape film so as to form a film-free section of said conductive lead inner lead portions said film-free sections of said conductive lead inner lead portions disposed between said housing rim and said base.

3. The semiconductor package of claim 2 wherein said inner lead portions each have an end for bonding to one of the chip bond points, and said inner support ring is spaced away from the ends of said conductive lead inner lead portions.

4. The semiconductor package of claim 1 wherein an outer support ring is disposed over the ends of said lead outer lead portions, and said outer support ring is spaced away from said tape film.

5. The semiconductor package of claim 1 wherein further including:
   (a) said tape film comprises an insulating dielectric material;
   (b) a conductive film is affixed to said tape film opposite the surface of said tape film carrying said leads; and
   (c) at least one of said leads in electrical connection with said conductive film through said tape film.

6. The semiconductor package of claim 5 wherein said leads in electrical contact with said metal film are connected therebetween by vias.

7. A lead tape assembly for providing electrical connections to an electronic component having at least one bond point for making an electrical connection thereto, the lead tape assembly including:
   (A) a dielectric film having two opposed surfaces, and having a perimeter a portion of which is complementary to the perimeter of the electronic component so that said film may be placed adjacent the electronic component;
   (B) a plurality of conductive leads on one of said dielectric film surfaces, each of said conductive leads having an inner lead portion which extends beyond said film perimeter complementary to the electronic component perimeter for bonding to one of the component bond points, and an outer lead which extends beyond the perimeter of said film for bonding to an external conductive element, whereby the component bond point is electrically connected to the external conductive element;
   (C) a conductive film on said film surface opposite said dielectric film surface said conductive leads are attached thereto; and
   (D) means for electrically connecting at least two of said conductive leads to said conductive film through said dielectric film.

8. The lead tape assembly of claim 7 further including at least one via extending between said conductive leads and said conductive film through said dielectric film for electrically connecting one of said conductive leads to said conductive film.

9. The lead tape assembly of claim 7 further including:
   said dielectric film forming an aperture for receiving the electronic component therein; and
   said conductive lead inner lead portions extending into said aperture for bonding to the electronic component bond points.

10. The lead tape assembly of claim 7 further including a non-conductive restraining means over said conductive lead outer portions, said restraining means spaced away from said dielectric film so that a portion of said conductive lead outer lead portions are exposed therebetween.

11. The lead tape assembly of claim 10 wherein said restraining means is a section of dielectric film.

12. The lead tape assembly of claim 7 further including a non-conductive restraining means over said conductive lead inner lead portions, said restraining means, spaced away from said dielectric film so that a portion of said conductive lead inner lead are exposed therebetween.

13. The lead tape assembly of claim 12 further including a non-conductive restraining means over said conductive lead outer portions, said restraining means spaced away from said dielectric film so that a portion of said conductive lead outer lead portions are exposed therebetween.

14. The lead tape assembly of claim 7 further including:
   said conductive film having a plurality of spaced apart sections, and means for electrically connecting at least one conductive lead to each of said conductive film sections.

15. A semiconductor package for protecting one or more fabricated semiconductor chips, each of the chips having at least one bond point for electrical connection to an external conductive element, said package comprising:
   (a) a housing enclosing each of the chips; and
   (b) a section of tape automated bonding tape comprising:
      (i) a section of tape film comprising an electrical insulating dielectric material surrounding at least a portion of each housing; and
      (ii) a plurality of conductive leads on said tape film, each of said conductive leads having an inner lead portion that extends into said housing and is connected to one of the chip bond points, and an outer lead portion that extends beyond the outer perimeter of said tape film for bonding to an external conductive element, whereby the chip bond point is electrically connected to the external conductive element by said conductive lead.
      (iii) a conductive film is affixed to said tape film opposite the surface of said tape film carrying said leads; and
      (iv) at least two of said leads in electrical connection with said conductive film through said tape film.

16. The semiconductor package of claim 1 further including a non-conductive restraining means over said conductive lead outer portions, said restraining means spaced away from said dielectric film so that a portion of said conductive lead outer lead portions are exposed therebetween.

17. The semiconductor package of claim 16 wherein said restraining means is a dielectric film.

* * * * *